(12) United States Patent
Lee et al.

(10) Patent No.: US 6,284,632 B1
(45) Date of Patent: Sep. 4, 2001

(54) METHOD FOR MANUFACTURING SEMICONDUCTOR DEVICE WITH STAGNATED PROCESS GAS

(75) Inventors: Se-Jin Lee; Jae-Chul Lee, both of Suwon; Hyun-Bo Shin, Kyunggi-do; Dae-Hoon Bae, Seoul, all of (KR)

(73) Assignee: Samsung Electronics Co., Ltd., Suwon (KR)

(*) Notice: Subject to any disclaimer, the term of this patent is extended or adjusted under 35 U.S.C. 154(b) by 0 days.

(21) Appl. No.: 09/429,046

(22) Filed: Oct. 29, 1999

(30) Foreign Application Priority Data

Nov. 3, 1998 (KR) .................................................. 98-46955

(51) Int. Cl.⁷ .................................................. H01L 21/22
(52) U.S. Cl. .................................................. 438/565; 438/5
(58) Field of Search .................................. 438/5, 7, 10, 11, 438/542, 565, 909, 935, 980, 14, 530, 541

(56) References Cited

U.S. PATENT DOCUMENTS 5,747,362 * 5/1998 Visser .................................. 438/758
5,758,680 * 6/1998 Kaveh et al. ........................... 137/14

OTHER PUBLICATIONS

Jolly, W. "The synthesis and characterization of inorganic compounds", Prentice Hall, pp. 524–526 (no month given), 1970.*

* cited by examiner

*Primary Examiner*—Keith Christianson
(74) *Attorney, Agent, or Firm*—Marger Johnson & McCollom, P.C.

(57) ABSTRACT

According to the present invention, a process of the present invention is performed with stagnated process gas in a chamber. The process comprises the steps of supplying process gas into a chamber, blocking process gas entry and exit from the chamber so as to stagnate the supplied gas therein, and performing the process. As a result, a process time can be significantly reduced, thereby maximizing yield and reducing the substantial amount of the process gas.

4 Claims, 7 Drawing Sheets

METHOD FOR MANUFACTURING SEMICONDUCTOR DEVICE WITH STAGNATED PROCESS GAS

FIELD OF THE INVENTION

The present invention relates to a method for manufacturing a semiconductor device, and more particularly to a method for manufacturing a semiconductor device using a diffusion process and an annealing process.

BACKGROUND OF THE INVENTION

In general, a diffusion process is performed to form a necessary layer and an annealing process is performed to recover crystalinity and stabilize physical property. During these processes, parameters such as temperature, gas, pressure, and reaction time are controlled to form a necessary layer.

In such a diffusion process, a desirable layer is formed in accordance with the kinds of gas and the thickness of the layer is decided in accordance with the reaction time. After process conditions such as temperature and pressure, are determined, a reaction gas is introduced to form a layer or to diffuse an impurity onto a layer. Since a conventional diffusion process is performed by introducing and simultaneously exhausting a gas (impurity source gas), this leads to a very long process time and a large amount of gas can be consumed. If the process is performed by raising internal temperature of the chamber, the gas is fast dissolved and the amount of dissolved gas increases to shorten the process time. However, as a semiconductor device structure has become highly integrated requiring a shallow junction, there is a limit to use this kind of method.

Recently, a $PH_3$ annealing process using a sheet-fed or a vertical furnace has been used to increase the capacitance of a semiconductor device.

FIG. 1 is a flow chart showing the steps of an annealing process in accordance with a conventional method for manufacturing a semiconductor device, and FIG. 2 is a diagram for depicting a conventional method for manufacturing a semiconductor device.

Referring to FIGS. 1–2, a conventional semiconductor device manufacturing process is performed by flowing a process gas. As shown in FIG. 2, the process gas is continuously supplied from a process gas supply apparatus 502 into a chamber 500 where a semiconductor manufacturing process is performed, and the supplied process gas is continuously exhausted from the chamber 500 through an exhausting apparatus 504. That is, the conventional semiconductor device manufacturing process is performed with a first valve 510 installed on a supply line 506 combining the process gas supply apparatus 502 with the chamber 500, and a second valve 512 installed on an exhausting line 508 combining the chamber 500 with the exhausting apparatus 504 being opened.

The conventional $PH_3$ annealing process, as shown in FIG. 1, includes the steps of loading a semiconductor wafer into a chamber (S1000), setting process conditions in the chamber (S1005), forming process gas flow (S1010), performing an annealing process (S1015), then, blocking process gas and purging the inside of the chamber (S1020), dropping internal temperature of the chamber (S1025), and unloading the semiconductor wafer from the chamber (S1030) when the annealing process is completed.

FIG. 3 is a graph showing a difference between the semiconductor device capacitance acquired through an annealing process of FIG. 1 and the capacitance without an annealing process.

Referring to FIG. 3, the semiconductor device capacitance "A" acquired through the $PH_3$ annealing process is higher than the capacitance "B" acquired without the $PH_3$ annealing process. A conventional $PH_3$ annealing process is performed at a high temperature (about 750° C.) for 3 hours and uses $PH_3$ of 1.5 l/min. Accordingly, this $PH_3$ annealing process taking a long time, results in lower yield. The time for flowing process gas practically takes 50% and more out of total time for performing a conventional $PH_3$ annealing process. Since the process is performed by continuously supplying the process gas, a lot of the process gas can be wasted. That is, $PH_3$ of 270 l is used while performing one time of the annealing process.

Consequently, a conventional a semiconductor device manufacturing process has drawbacks such as a long process time, low yield, and waste of process gas.

SUMMARY OF THE INVENTION

It is an object of the present invention to provide a method for manufacturing a semiconductor device which can reduce process time and the amount of process gas used.

According to the present invention, a method for manufacturing a semiconductor device by performing a predetermined process with respect to a predetermined object in a chamber by using process gas comprises the steps of supplying the process gas into the chamber, blocking the chamber so as to stagnate supplied process gas in the chamber, and performing the process.

According to the present invention, the step of performing the process further comprises the steps of determining whether the amount of the process gas in the chamber is less than a threshold and supplying more process gas into the chamber, if the process gas is less than the threshold, and then repeating the blocking step.

In the preferred embodiment, the process is a diffusion process or an annealing process.

A present invention process is performed by stagnating process gas in a chamber, so that a process time can be significantly reduced. As a result, it is possible to maximize yield and to substantially reduce the amount of the process gas.

BRIEF DESCRIPTION OF THE DRAWINGS

The accompanying drawings illustrate the present invention and, together with the description, further serve to explain the principle of the invention and to enable those skilled in the pertinent art to make and use the invention.

DETAILED DESCRIPTION OF PREFERRED EMBODIMENTS

Hereinafter, the preferred embodiment of the present invention will be described in detail with reference to accompanying drawings FIGS. 4–7.

Figure 1:
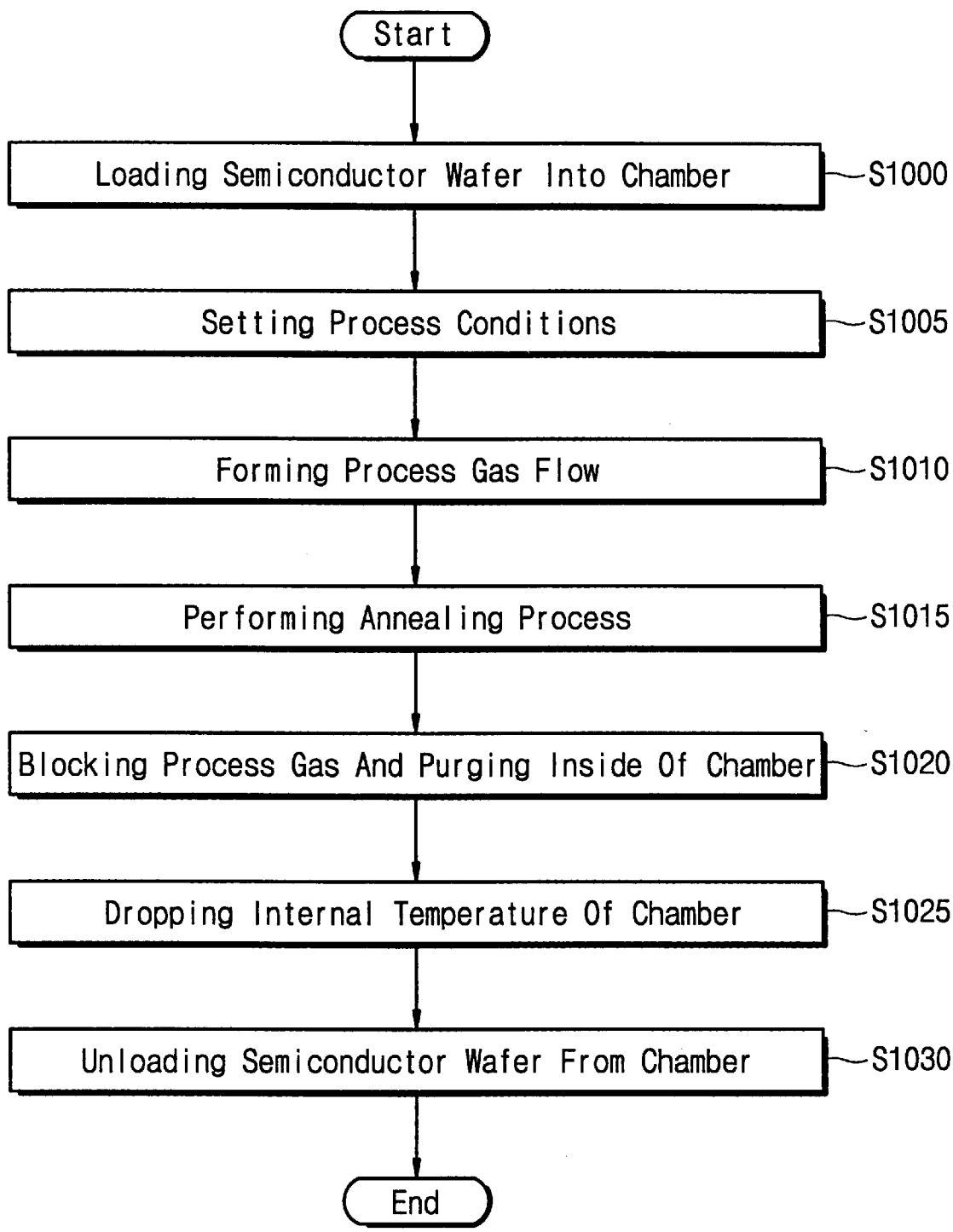
FIG. 1 is a flow chart showing the steps of an annealing process in accordance with a conventional method for manufacturing a semiconductor device.
Figure 2:
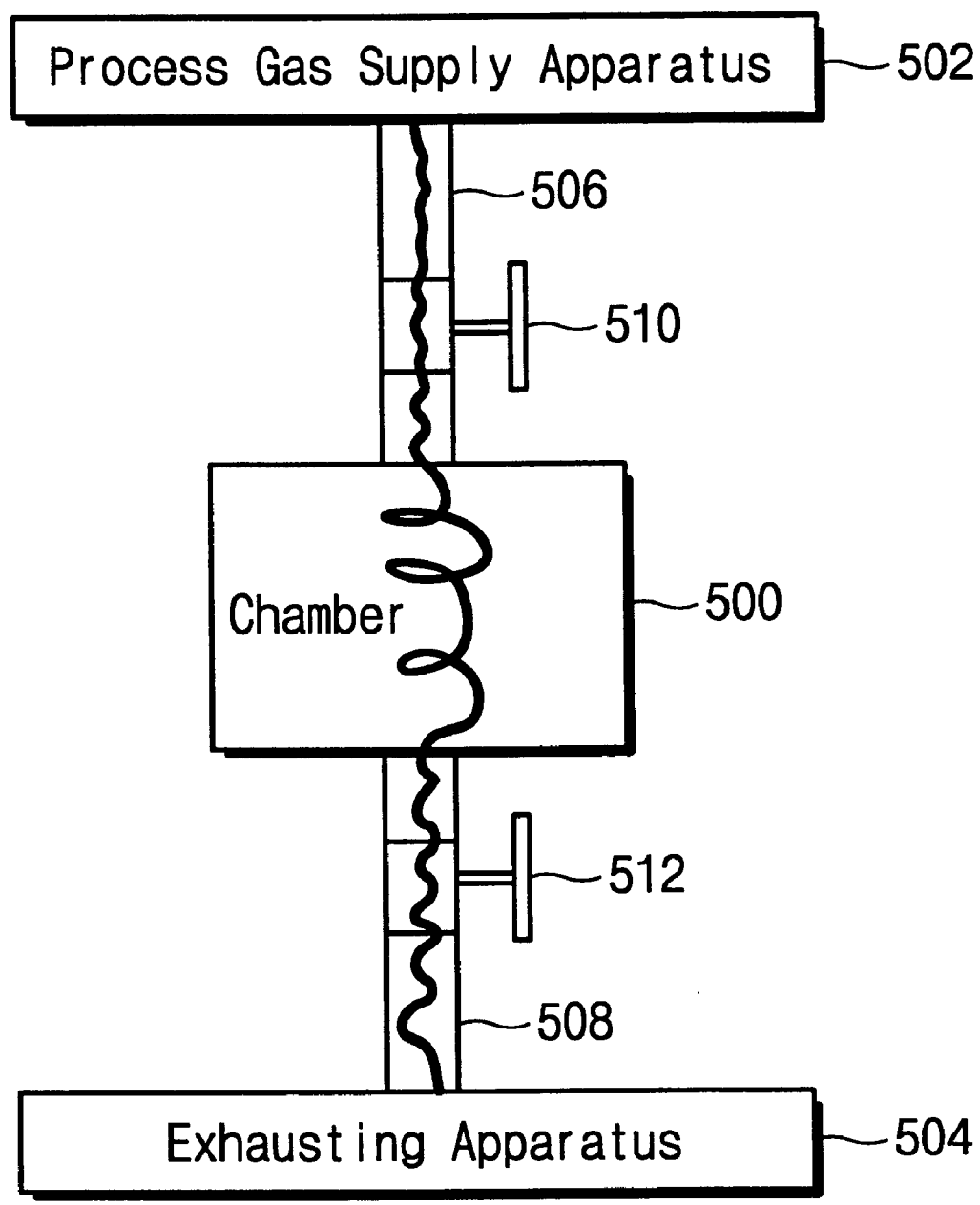
FIG. 2 is a diagram for depicting a conventional method for manufacturing a semiconductor device.
Figure 3:
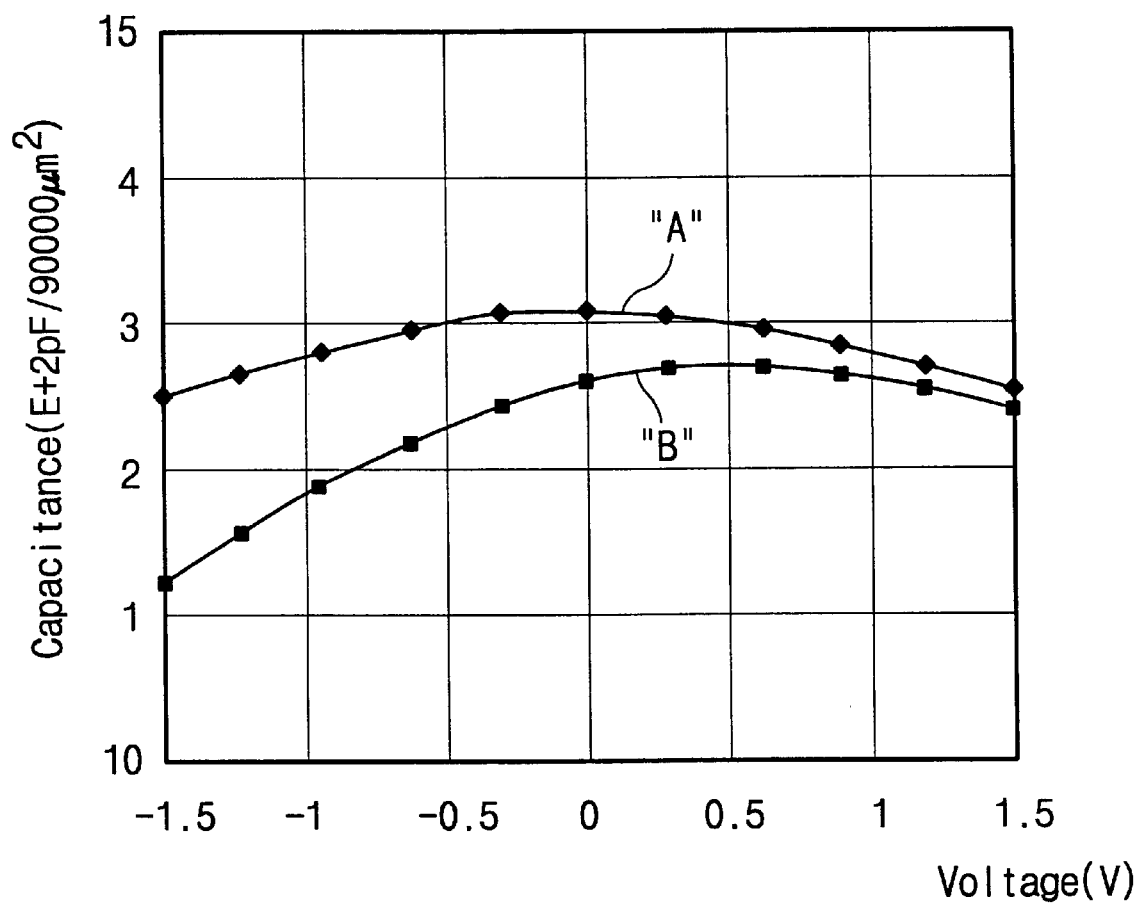
FIG. 3 is a graph showing difference between semiconductor device capacitance acquired through an annealing process of FIG. 1 and capacitance without an annealing process.
Figure 4:
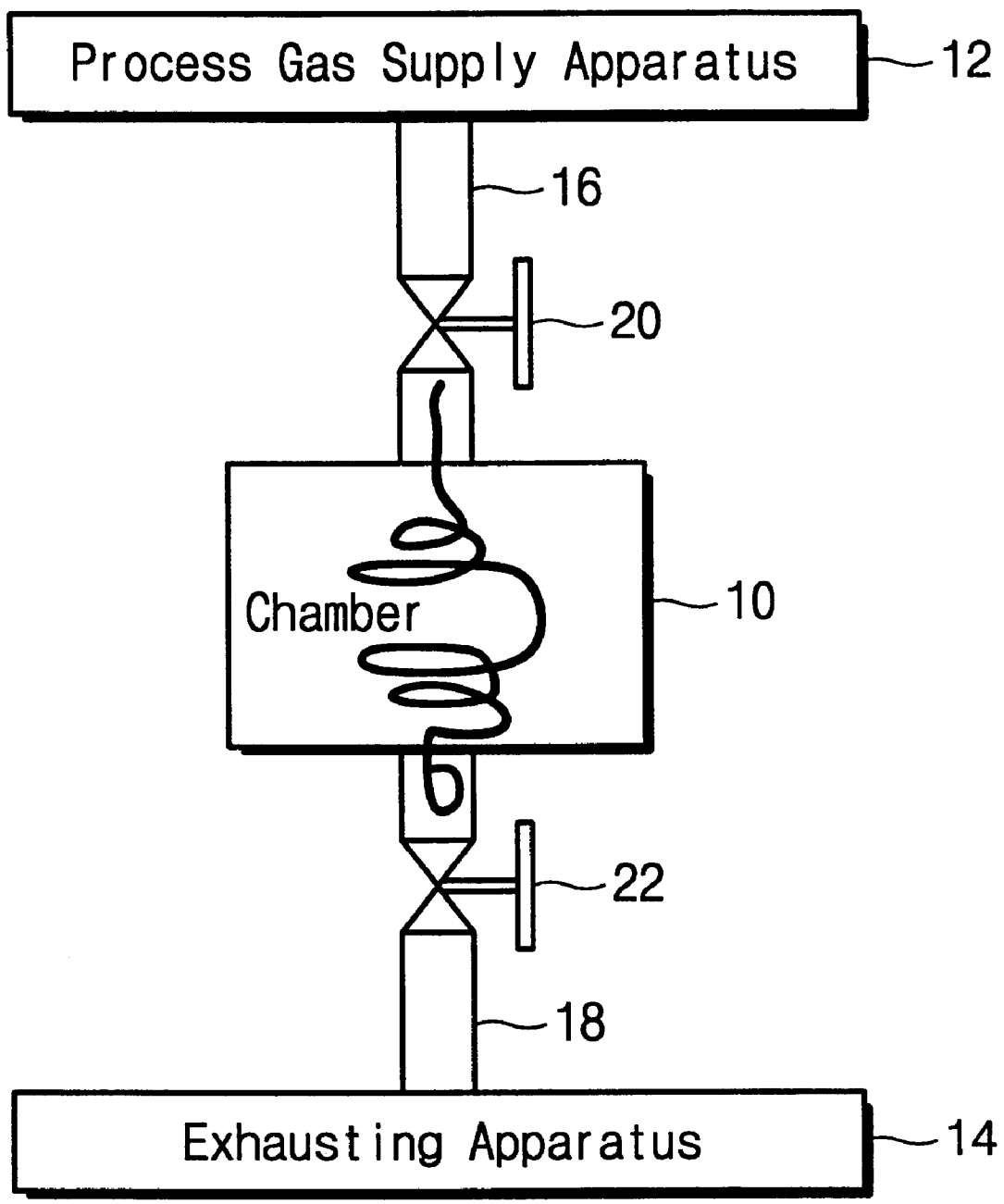
FIG. 4 is a diagram for depicting a method for manufacturing a semiconductor device in accordance with the present invention.

FIG. 4 is a diagram illustrating a method for manufacturing a semiconductor device in accordance with the present invention.

Referring to FIG. 4, a semiconductor device manufacturing process is performed with stagnated process gas in a chamber 10. After supplying the process gas from a process gas supply apparatus 12 into the chamber 10, a first valve 20 installed on a supply line 16 and a second valve 22 installed on an exhausting line 18 are locked to stagnate the process gas supplied into the chamber 10. When the process is ended, the process gas is exhausted from the chamber 10 by an exhausting apparatus 14. In this regard, by stagnating the process gas in a chamber, high reaction efficiency of the process gas can be obtained.

The reactivity of the process gas, for example, increases during the diffusion or annealing processes, so that a process can be performed in a short period of time. Since the process is performed with stagnated process gas in the chamber 10, the amount of the process gas stagnated therein may become lacking as time progresses. In order to remedy this drawback, the amount of the gas is measured and, if less than a threshold, more process gas is supplied to the chamber so as to continuously perform the process.

Figure 5:
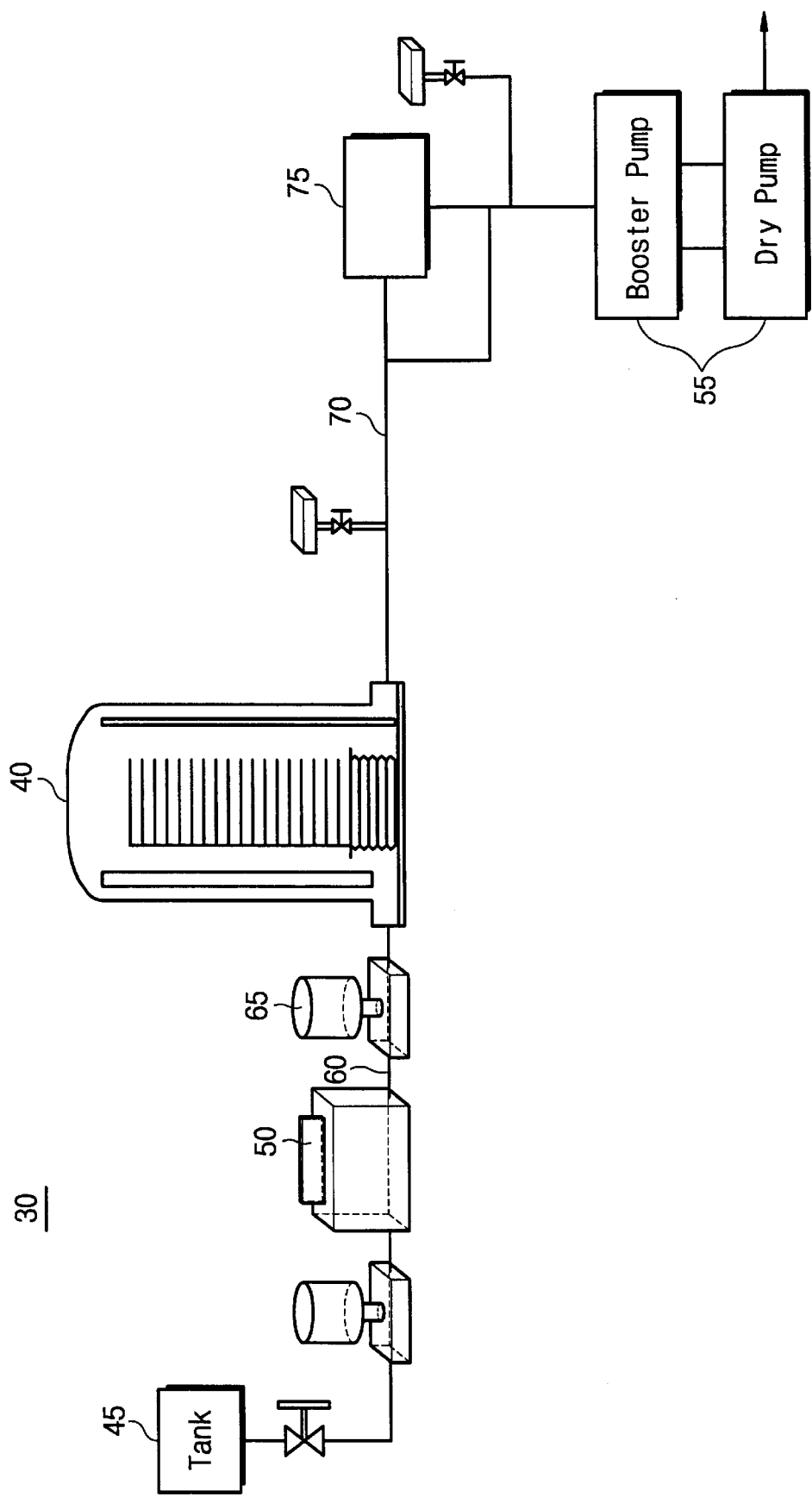
FIG. 5 is a schematic view of an annealing system applying a method for manufacturing a semiconductor device in accordance with the present invention.

FIG. 5 is a schematic view of an annealing system applying a method for manufacturing a semiconductor device in accordance with the present invention.

Referring to FIG. 5, an annealing system 30 includes a chamber 40, a tank 45, and an exhausting apparatus 55 such as a booster pump and a dry pump. A mass flow controller 50 for controlling the amount of process gas supplied from the tank 45 into the chamber 40 and a first valve 65 are installed on a supply line 60 combining the chamber 40 with the tank 45. A second valve 75 is installed on an exhausting line 70 combining the chamber 40 with the exhausting apparatus 55. The annealing system 30 supplies process gases such as $PH_3$ from the tank 45 into the chamber 40, for the annealing process.

Figure 6:
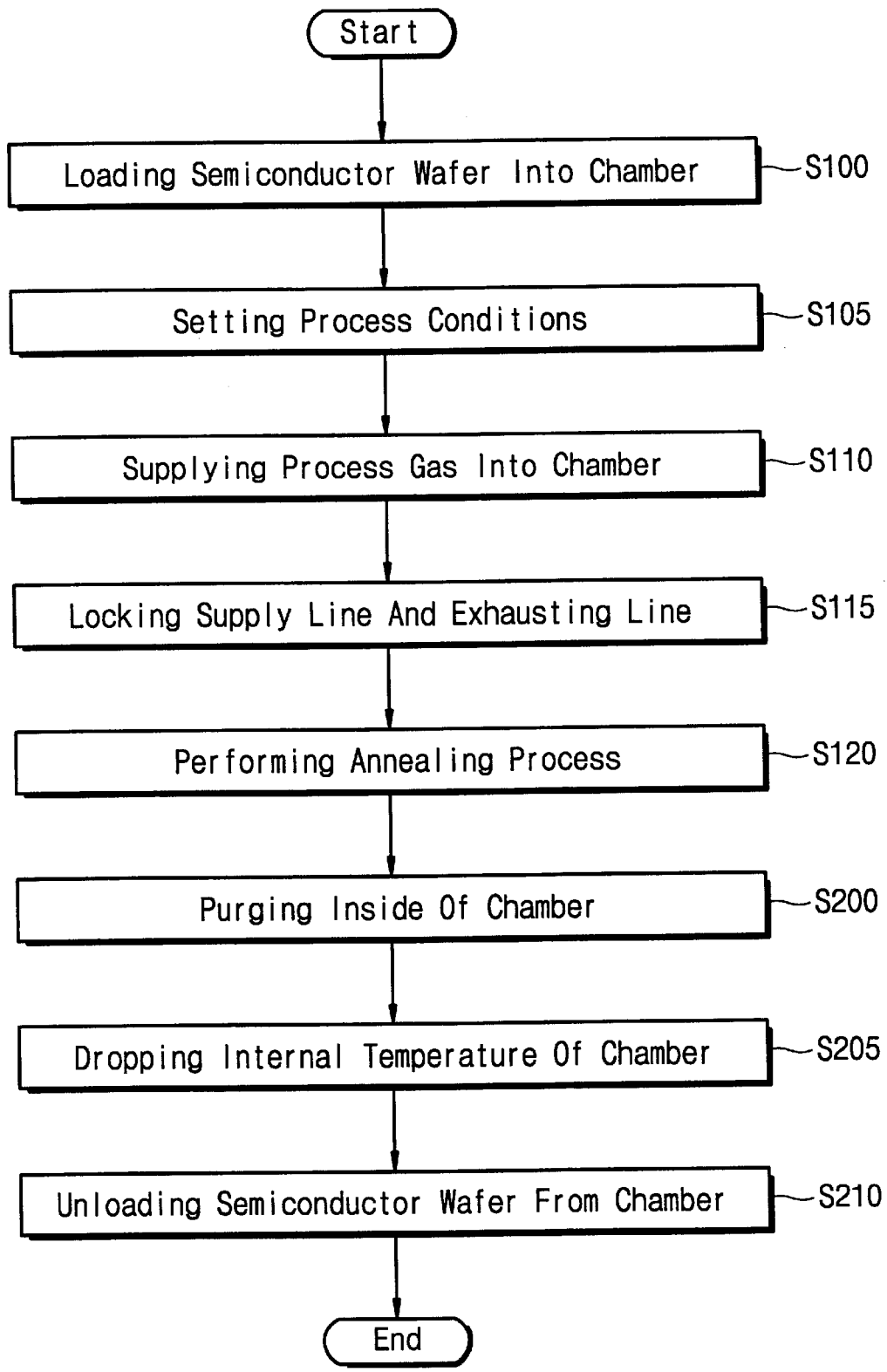
FIG. 6 is a flow chart showing the steps of a method for manufacturing a semiconductor device in accordance with the present invention.

FIG. 6 is a flow chart showing the steps of a semiconductor device manufacturing process in accordance with the present invention.

As shown in FIG. 6, a $PH_3$ annealing process using an annealing system 30 can apply a method of the present invention. Referring to FIGS. 5–6, this annealing process comprises the steps of loading a semiconductor wafer into a chamber 40 (S100), setting internal process conditions of the chamber 40 (S105), supplying process gas ($PH_3$) into the chamber 40 (S110), blocking a supply line 60 and an exhausting line 70 to stagnate the process gas in the chamber 40 (S115), performing an annealing process (S120), purging the inside of the chamber 40 (S200), dropping internal temperature of the chamber 40 (S205), and unloading the semiconductor wafer from the chamber 40 (S210) when the annealing process is ended. In particular, in accordance with the present invention, the process gas is supplied into the chamber 40 and then a first valve 65 and a second valve 75 are locked to stagnate the supplied process gas therein. That is, the present invention method is performed by stagnating the process gas in the chamber 40.

Figure 7:
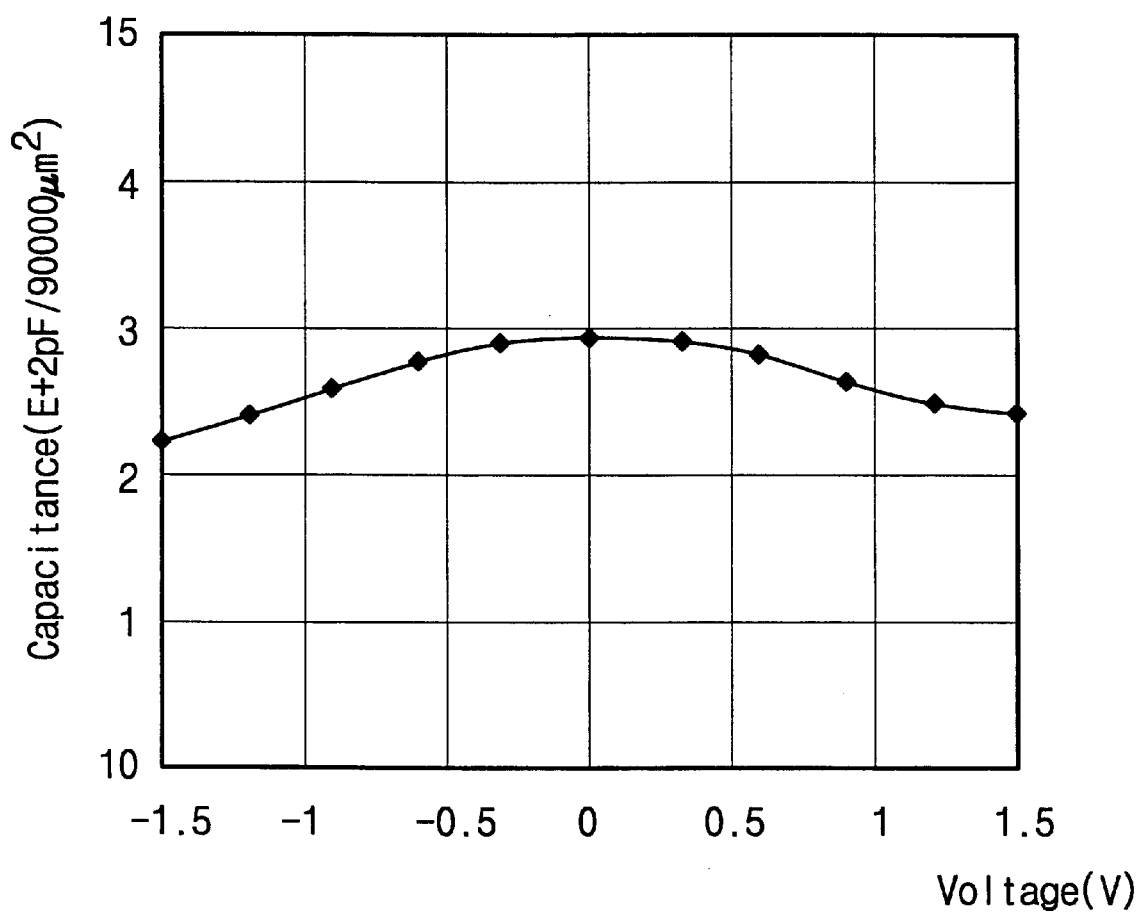
FIG. 7 is a graph showing semiconductor device capacitance acquired through an annealing process of FIG. 6 applying a method for manufacturing a semiconductor device in accordance with the present invention.

FIG. 7 is a graph showing the semiconductor device capacitance acquired through an annealing process of FIG. 6 applying a method of the present invention.

This $PH_3$ annealing process is performed at about 750° C. for 30 minutes by using $PH_3$ of 1.5 l/min, so that the capacitance is equal to that of a conventional method, as shown in FIG. 7. That is, a process time and the amount of process gas used can be significantly reduced compared to a conventional $PH_3$ annealing process.

As mentioned above, during the $PH_3$ annealing process of this invention, it is determined that whether the process gas stagnated in the chamber 40 is less than a threshold while performing the annealing process. If less than the threshold, additional process gas is then supplied into the chamber 40. As a result, this process can be continuously performed. This is provided in case the amount of process gas is reduced and lacking in the chamber 10 as time progresses, because the present invention process is performed with stagnated process gas in the chamber. That is, the amount of the process gas in the chamber 10 is measured while performing a process and, if it is less than the threshold, more process gas is supplied to the chamber so as to continuously perform the process. Also, the interval of process gas resupply time can be set by a test.

As described above, since a process of this invention is performed with stagnated process gas in a chamber, a process time can be significantly reduced. As a result, it is possible to maximize yield and reduce the amount of the process gas.

While the invention has been described with respect to particular embodiment above, it will be understood by those skilled in the art that modifications may be made without departing from the spirit and scope of the present invention.

What is claimed is:

1. A method for manufacturing a semiconductor device by performing a diffusion or annealing process with respect to a predetermined object in a chamber by using a diffusion or annealing process gas, comprising the steps of:

supplying said diffusion or annealing process gas into said chamber;

blocking diffusion or annealing process gas entry and exit from said chamber to stagnate said supplied process gas in said chamber; and performing said diffusion or annealing process.

2. The method of claim 1, wherein the step of perfoming said process further comprises the steps of:

determining whether the amount of said process gas in said chamber is less than a threshold; and supplying more process gas into said chamber, if said process gas is less than the threshold, and then repeating the blocking step.

3. The method of claim 1, wherein said annealing process gas is $PH_3$.

4. The method of claim 1, wherein said annealing process is performed at about 750° C. for 30 minutes by using $PH_3$ of 1.5 l/min.

\* \* \* \* \*